(12) United States Patent
Chen et al.

(10) Patent No.: US 12,031,313 B2
(45) Date of Patent: Jul. 9, 2024

(54) RETRACTABLE SWITCH MECHANISM

(71) Applicant: XIAMEN ANBOLY TECHNOLOGY CO., LTD., Xiamen (CN)

(72) Inventors: Jiaxu Chen, Xiamen (CN); Zihong Chen, Xiamen (CN); Zheng'er Chen, Xiamen (CN); Ziquan Chen, Xiamen (CN)

(73) Assignee: XIAMEN ANBOLY TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 18/533,015

(22) Filed: Dec. 7, 2023

(65) Prior Publication Data

US 2024/0133169 A1    Apr. 25, 2024

Related U.S. Application Data

(63) Continuation of application No. PCT/CN2021/114988, filed on Aug. 27, 2021.

(30) Foreign Application Priority Data

Jun. 8, 2021 (CN) .......................... 202121277790.X
Jun. 8, 2021 (CN) .......................... 202121278537.6

(Continued)

(51) Int. Cl.
*E03D 5/10* (2006.01)
*H05K 7/14* (2006.01)

(52) U.S. Cl.
CPC ............. *E03D 5/10* (2013.01); *H05K 7/1427* (2013.01)

(58) Field of Classification Search
CPC ................................ E03D 5/10; H05K 7/1427
(Continued)

(56) References Cited

U.S. PATENT DOCUMENTS 6,349,921 B1 * 2/2002 Jahrling ............... E03D 3/04
                                                        4/406
6,877,170 B1 * 4/2005 Quintana ............. E03D 5/10
                                                        4/406
(Continued)

FOREIGN PATENT DOCUMENTS

CN    206815466 U    12/2017
CN    107869171 A    4/2018
(Continued)

OTHER PUBLICATIONS

Internation Search Report of PCT/CN2021/114988, dated Mar. 8, 2022.

*Primary Examiner* — Huyen D Le (57) ABSTRACT

A retractable switch mechanism, comprising an intelligent toilet having an inner cavity and a switch assembly arranged in the inner cavity of the intelligent toilet. An avoidance hole communicated with the inner cavity of the intelligent toilet is formed in the side wall of the intelligent toilet, and the switch assembly comprises a switch capable of moving between a first position where the switch extends out of the avoidance hole and a second position where the switch retracts into the avoidance hole. The switch can extend out of the inner cavity of the intelligent toilet when needing to be used and can be accommodated in the inner cavity of the intelligent toilet when not needing to be used, so that the risk that when the intelligent toilet is mounted in a bathroom without dry-wet separation.

39 Claims, 10 Drawing Sheets

(30) Foreign Application Priority Data

Jun. 8, 2021 (CN) .......................... 202121278636.4
Jul. 29, 2021 (CN) .......................... 202121742826.7

(58) Field of Classification Search
USPC .......................................................... 4/300
See application file for complete search history.

(56) References Cited

U.S. PATENT DOCUMENTS

| 2003/0041999 | A1* | 3/2003 | Hury | ..................... B22D 11/12 |
| --- | --- | --- | --- | --- |
| | | | | 164/417 |
| 2012/0167990 | A1* | 7/2012 | Maercovich | ........ F16K 31/3855 |
| | | | | 137/1 |
| 2019/0211539 | A1 | 7/2019 | Tang | |

FOREIGN PATENT DOCUMENTS

| CN | 212866189 U | 4/2021 |
| --- | --- | --- |
| EP | 3276094 A1 | 1/2018 |

* cited by examiner

RETRACTABLE SWITCH MECHANISM

CROSS-REFERENCE TO RELATED APPLICATIONS

This application is a continuation of International Patent Application No. PCT/CN2021/114988 with a filing date of Aug. 27, 2021, designating the United States, now pending, and further claims priority to Chinese Patent Application No. 202121277790.X with a filing date of Jun. 8, 2021, Chinese Patent Application No. 202121278636.4 with a filing date of Jun. 8, 2021, Chinese Patent Application No. 202121278537.6 with a filing date of Jun. 8, 2021, Chinese Patent Application No. 202121742826.7 with a filing date of Jul. 29, 2021. The content of the aforementioned applications, including any intervening amendments thereto, are incorporated herein by reference.

TECHNICAL FIELD

The present invention relates to the technical field of sanitary products, in particular to a retractable switch mechanism.

BACKGROUND OF THE PRESENT INVENTION

The existing intelligent toilet generally comprises many functions, such as human body cleaning function, human body drying function, seat ring heating function, sterilization function and deodorization function. Switches that control these functions are generally buttons, control panels, remote controllers or knobs. At present, in some intelligent toilets, the switches are arranged on the side edges of intelligent toilet cover plates, and the positions are usually fixed in design. In this way, if the intelligent toilet is installed in a bathroom without dry-wet separation, the switches will often be splashed by shower water and the switch functions may be abnormal.

SUMMARY OF PRESENT INVENTION

To solve the above problems, the present invention provides a retractable switch mechanism.

To achieve the above purpose, the present invention adopts the following technical solution:

A retractable switch mechanism comprises an intelligent toilet having an inner cavity and a switch assembly arranged in the inner cavity of the intelligent toilet. An avoidance hole communicated with the inner cavity of the intelligent toilet is formed in the side wall of the intelligent toilet, and the switch assembly comprises a switch capable of moving between a first position where the switch extends out of the avoidance hole and a second position where the switch retracts into the avoidance hole.

Compared with the prior art, the present invention has at least the following beneficial effects:

1. In the present invention, the switch is designed to be capable of moving between the first position where the switch extends out of the avoidance hole on the intelligent toilet and the second position where the switch retracts into the avoidance hole, so that the switch can extend out of the inner cavity of the intelligent toilet when needing to be used and can be accommodated in the inner cavity of the intelligent toilet when not needing to be used. The switch is especially suitable for being installed on an intelligent toilet of a bathroom without dry-wet separation to effectively prevent the switch from being splashed by shower water, the structure is quite novel, and different experience can be brought to a user.

2. The driving unit adopts the gear and rack transmission assembly or connecting rod transmission assembly or cam structure or double gear transmission structure or pneumatic retractable structure, and has simple structure and reliable transmission.

3. The induction unit is arranged which sends an induction signal to the main control board of the intelligent toilet, and the main control board controls the driving unit to drive forward or reversely according to the induction signal, so that the switch is automatically controlled to move to the first position or move to the second position through induction, without manual retractable control of the switch, which is more convenient to use.

4. The operating assembly is arranged in the housing, and the driving cam and the first spring are arranged respectively at the upper and lower ends of the operating assembly to drive the operating assembly to move and reset, so that when a user needs to use the operating assembly, the operating assembly can protrude out of the housing for convenient use, and when the operating assembly is not needed to be used, the operating assembly can be returned into the housing to protect the operating assembly.

5. The retractable sleeve is arranged in the housing group, the control assembly is arranged in the retractable sleeve, and the driving motor drives the driving gear to engage with the retractable sleeve and rotate, so that the retractable sleeve and the control element produce upward movement and extension or downward movement and retraction. Thus, when the user needs to use the control element, the control element can protrude out of the housing group for convenient use, and when the control element is not needed to be used, the control element can be returned into the housing group to protect the control element.

6. The knob seat and the knob are arranged in the housing, and the gas supply unit is arranged as the driving unit to control the knob to extend out of or retract into the housing. The structure is simple and the layout is flexible.

DESCRIPTION OF THE DRAWINGS

In order to make the advantages of the present invention easier to understand, the present invention briefly described above will be described in more detail by reference to the specific embodiments shown in the drawings. It is understood that these drawings depict only typical embodiments of the present invention and therefore shall not be regarded as limitations to the protection scope. The present invention is described and explained by the drawings with additional characteristics and details. In the drawings.

DETAILED DESCRIPTION OF PREFERRED EMBODIMENTS

In order to make the technical problems to be solved, technical solutions and beneficial effects of the present invention more clear, the present invention is further explained in detail below in combination with the drawings and embodiments. It should be understood that the specific embodiments described herein are intended only to explain the present invention, not to limit the present invention.

As shown in FIG. 1 to FIG. 5, a retractable switch mechanism in a first embodiment of the present invention comprises an intelligent toilet (not shown) having an inner cavity and a switch assembly arranged in the inner cavity of the intelligent toilet. An avoidance hole (not shown) communicated with the inner cavity of the intelligent toilet is formed in the side wall of the intelligent toilet, and the switch assembly comprises a switch capable of moving between a first position where the switch extends out of the avoidance hole and a second position where the switch retracts into the avoidance hole. The switch is designed to be capable of moving between the first position where the switch extends out of the avoidance hole on the intelligent toilet and the second position where the switch retracts into the avoidance hole, so that the switch can extend out of the inner cavity of the intelligent toilet when needing to be used and can be accommodated in the inner cavity of the intelligent toilet when not needing to be used. The switch is especially suitable for being installed on an intelligent toilet of a bathroom without dry-wet separation to effectively prevent the switch from being splashed by shower water, the structure is quite novel, and different experience can be brought to a user.

In the present embodiment, the intelligent toilet comprises a driving unit 3 which is used for driving the switch to move between the first position where the switch extends out of the avoidance hole and the second position where the switch retracts into the avoidance hole. In some other embodiments not shown, the driving unit 3 may also be not provided, but replaced by a mechanical retractable unit (not shown) which is driven by the switch when the switch is directly driven. The mechanical retractable unit controls the switch to alternately switch between the first position and the second position. The mechanical retractable unit can adopt the existing common structure, such as an elastic mechanical retractable unit similar to that on a ballpoint pen head.

In the present embodiment, the switch assembly further comprises a base 1; and the base 1 is arranged in the inner cavity of the intelligent toilet. The base 1 is provided with an accommodating cavity 11, and the accommodating cavity 11 has an opening 12 corresponding to the avoidance hole. The switch assembly is located in the accommodating cavity; the switch extends out of the opening 12 when located in the first position; and the switch retracts into the opening 12 when located in the second position. The base 1 can be integrally formed with the intelligent toilet, or the base 1 is formed separately and then fixedly installed on the intelligent toilet.

Specifically, in the present embodiment, the switch assembly is a knob assembly 2, and the switch is an operating cover capable of rotating relative to the base 1. The knob assembly 2 further comprises a control board 22, a rotating element 23 and an operating body 24. The operating body 24 comprises a first body 24a and a second body 24b. The first body 24a is a hollow structure with a bottom opening, and the second body 24b is covered at the bottom opening of the first body 24a. The control board 22 is in limit fit with the base 1 in a rotation direction of the operating cover 21; the rotating element 23 is in rotatable transmission fit with the operating cover 21; and the operating cover 21 drives the rotating element 23 to rotate relative to the control board 22. The operating body 24 is arranged on the base 1; the control board 22 is accommodated in the inner cavity 241 of the operating body; the operating body 24 is provided with a port 242 communicated with the inner cavity 241 of the operating body; the rotating element 23 is penetrated on the port 242; and the operating cover 21 is installed on the rotating element 23 and located outside the knob body 24. Thus, the operating cover 21, the control board 22, the rotating element 23 and the operating body 24 are assembled into a whole.

Figure 3:
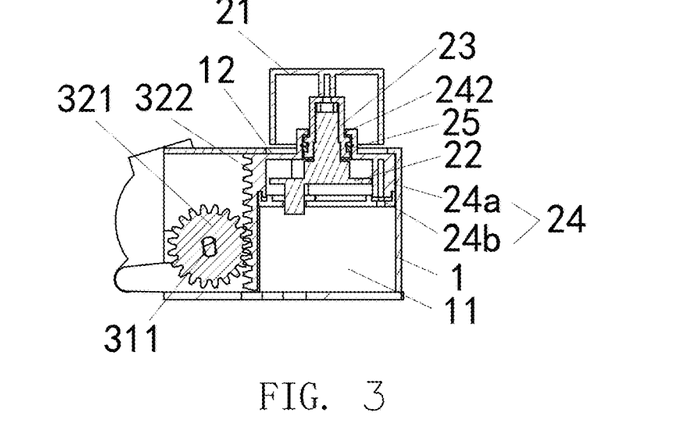
FIG. 3 is a sectional view when the operating cover of the retractable switch mechanism is in the first position according to the first preferred embodiment of the present invention.
Figure 5:
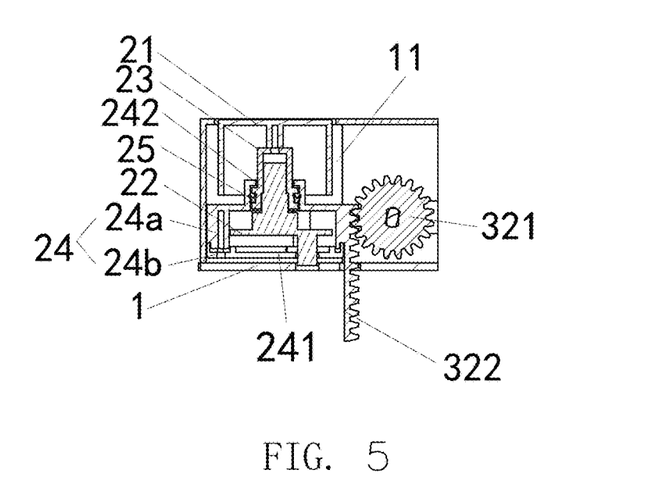
FIG. 5 is a sectional view when the operating cover of the retractable switch mechanism is in the second position according to the first preferred embodiment of the present invention.

As shown in FIG. 3 and FIG. 5, in order to perform waterproof protection for the control board 22, in the present embodiment, a first sealing element 25 is arranged between an outer wall of the rotating element 23 and an inner wall of the port 242. The first sealing element 25 specifically adopts a Y-shaped sealing ring, and the first sealing element 25 is installed on the outer wall of the rotating element 23. In the present embodiment, the operating body 24 is movably arranged on the base 1, and the driving unit 3 drives the operating body 24 to move relative to the base 1 so as to drive the operating cover 21 to move between the first position and the second position. The operating body 24 can be specifically installed on the base 1 slidably, and of course, can also be installed on the base 1 by a swingable mode, etc.

In the present embodiment, the driving unit 3 is arranged on the base 1; the driving unit 3 comprises a driving motor 31 and a transmission assembly 32; and the driving motor drives a knob assembly 2 through the transmission assembly 32. Specifically, the transmission assembly 32 adopts a gear and rack transmission assembly 32; the gear and rack transmission assembly 32 comprises a gear 321 and a rack 322 engaged with each other; the gear 321 is rotatably arranged on the base 1; an output shaft 311 of the driving motor 31 is connected with the gear 321; and the rack 322 is connected with the knob assembly 2. In the present embodiment, the rack 322 and the operating body 24 are formed integrally.

The present embodiment further comprises an induction unit (not shown). The induction unit sends an induction signal to a main control board (not shown) of the intelligent toilet, and the main control board controls the driving unit 3 to drive forward or reversely according to the induction signal. Preferably, the present embodiment is designed as follows: when the induction unit senses that someone is near the intelligent toilet or someone seats on the intelligent toilet, the induction signal is sent to the main control board of the intelligent toilet, and the main control board controls the driving unit 3 to drive forward according to the induction signal, so as to drive the operating cover 21 to move from the second position to the first position for driving by hands. On the contrary, when the induction unit senses that someone is away from the intelligent toilet or someone is away from the seat, the induction signal is sent to the main control board of the intelligent toilet, and the main control board controls the driving unit 3 to drive reversely according to the induction signal, so as to drive the operating cover 21 to move from the first position to the second position to realize the storage of the operating cover 21. In other embodiments, the operating body 24 may also be fixedly arranged on the base 1, and the driving unit 3 directly drives the operating cover 21 to move relative to the operating body 24.

In the present embodiment, the intelligent toilet comprises an intelligent toilet seat (not shown) and an intelligent toilet cover (not shown); and the intelligent toilet seat or the intelligent toilet cover is provided with the inner cavity of the intelligent toilet and the avoidance hole. In other embodiments, the switch assembly can also select a handle assembly or a button assembly or a control panel assembly; and correspondingly, the switch adopts a handle or a button or a control panel, etc.

Figure 1:
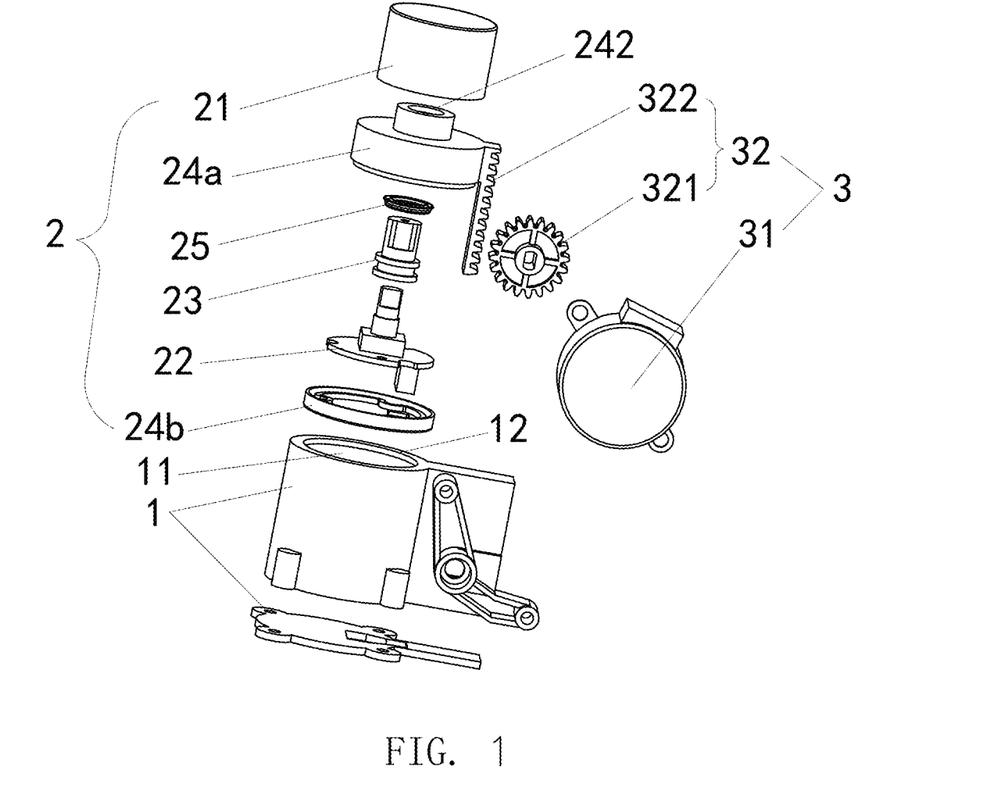
FIG. 1 is a three-dimensional exploded view of a retractable switch mechanism according to a first preferred embodiment of the present invention.
Figure 2:
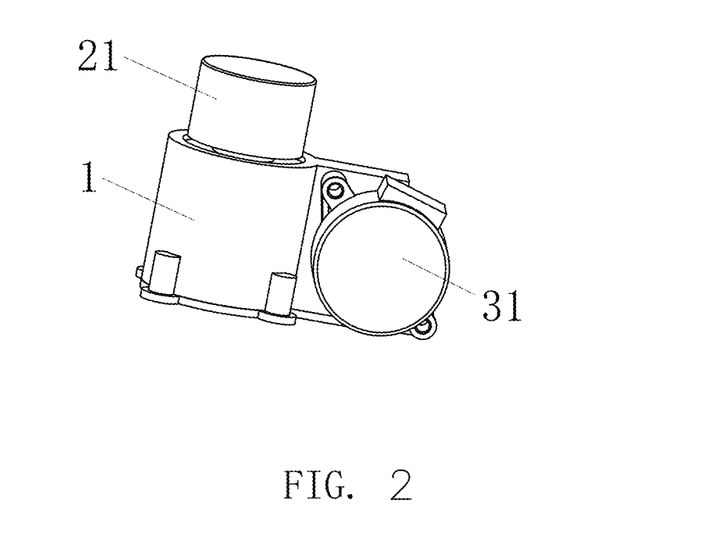
FIG. 2 is a three-dimensional assembly diagram when an operating cover of a retractable switch mechanism is in a first position according to the first preferred embodiment of the present invention.

The working process of the present embodiment: as shown in FIG. 2 and FIG. 3, when the induction unit senses that someone is near the intelligent toilet or someone sits on the intelligent toilet, the induction signal is sent to the main control board of the intelligent toilet, and the main control board controls the driving motor 31 of the driving unit 3 to rotate forward according to the induction signal. Then, the driving motor 31 drives the gear 321 to rotate forward; the gear 321 drives the rack 322 to move in the direction near the opening 12 of the base 1; and the rack 322 then drives the knob assembly 2 so that the operating cover 21 moves from the second position to the first position for driving by hands.

Figure 4:
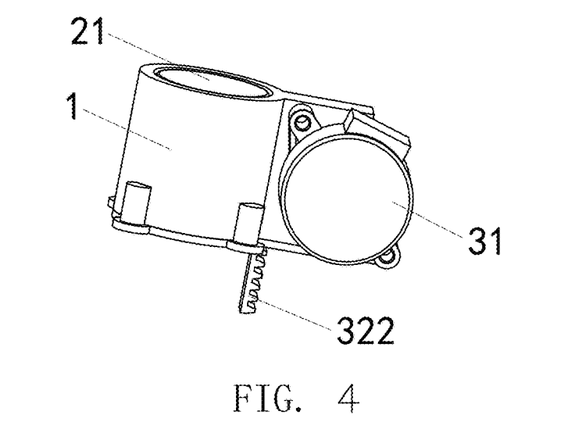
FIG. 4 is a three-dimensional assembly diagram when an operating cover of a retractable switch mechanism is in a second position according to the first preferred embodiment of the present invention.

As shown in FIG. 4 and FIG. 5, when the induction unit senses that someone is away from the intelligent toilet or someone is away from the seat, an induction signal is sent to the main control board of the intelligent toilet, and the main control board controls the driving motor 31 of the driving unit 3 to rotate reversely according to the induction signal. Then, the driving motor 31 drives the gear 321 to rotate reversely; the gear 321 drives the rack 322 to move away from the opening 12 of the base 1; and the rack 322 then drives the knob assembly 2 so that the operating cover 21 moves from the first position to the second position to realize the storage of the operating cover 21.

Figure 6:
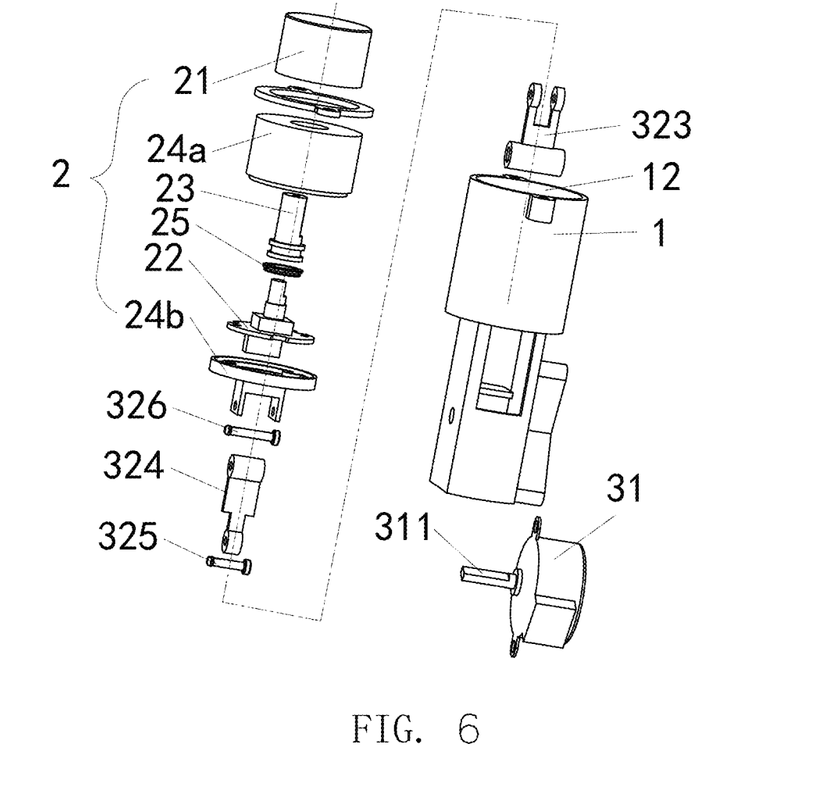
FIG. 6 is a three-dimensional exploded view of a retractable switch mechanism according to a second preferred embodiment of the present invention.
Figure 7:
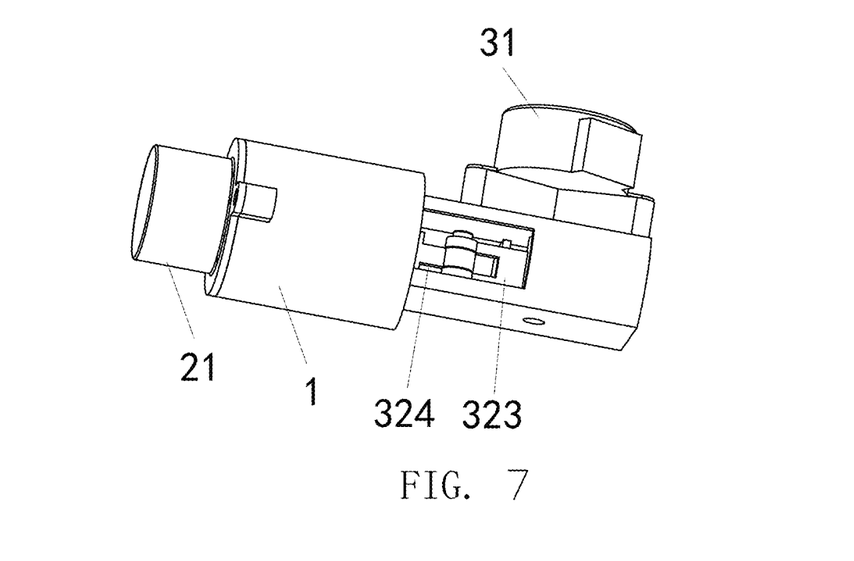
FIG. 7 is a three-dimensional assembly diagram when an operating cover of a retractable switch mechanism is in a first position according to the second preferred embodiment of the present invention.
Figure 8:
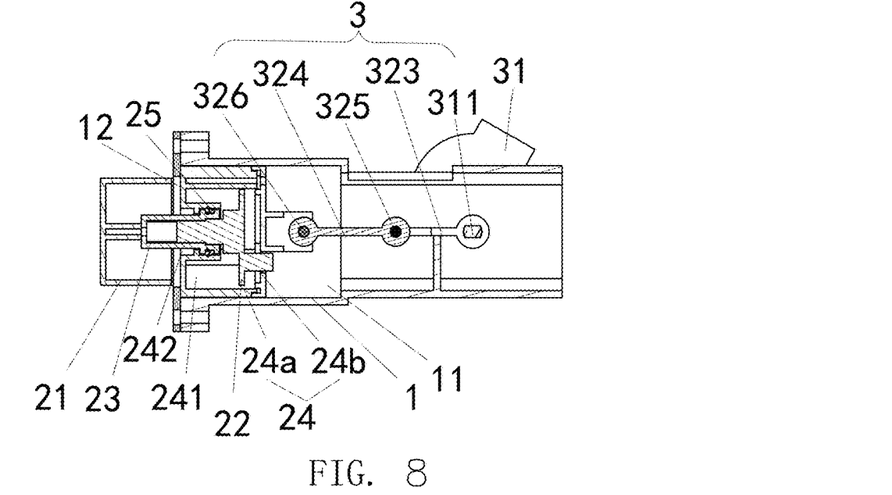
FIG. 8 is a sectional view when the operating cover of the retractable switch mechanism is in the first position according to the second preferred embodiment of the present invention.
Figure 9:
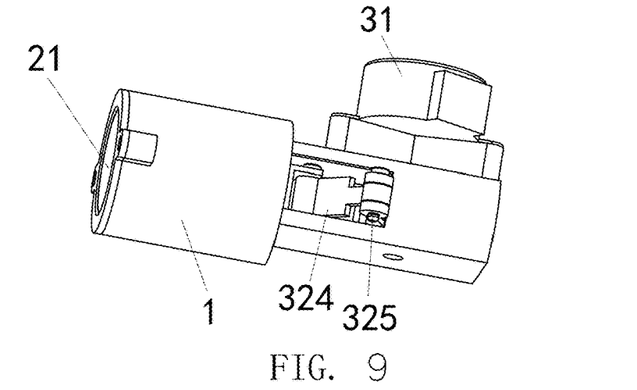
FIG. 9 is a three-dimensional assembly diagram when an operating cover of a retractable switch mechanism is in a second position according to the second preferred embodiment of the present invention.
Figure 10:
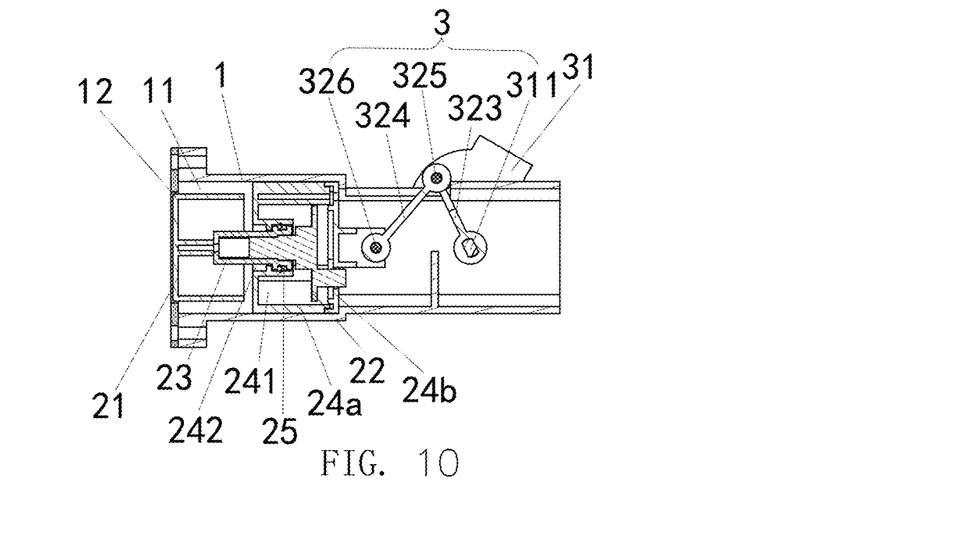
FIG. 10 is a sectional view when the operating cover of the retractable switch mechanism is in the second position according to the second preferred embodiment of the present invention.
Figure 11:
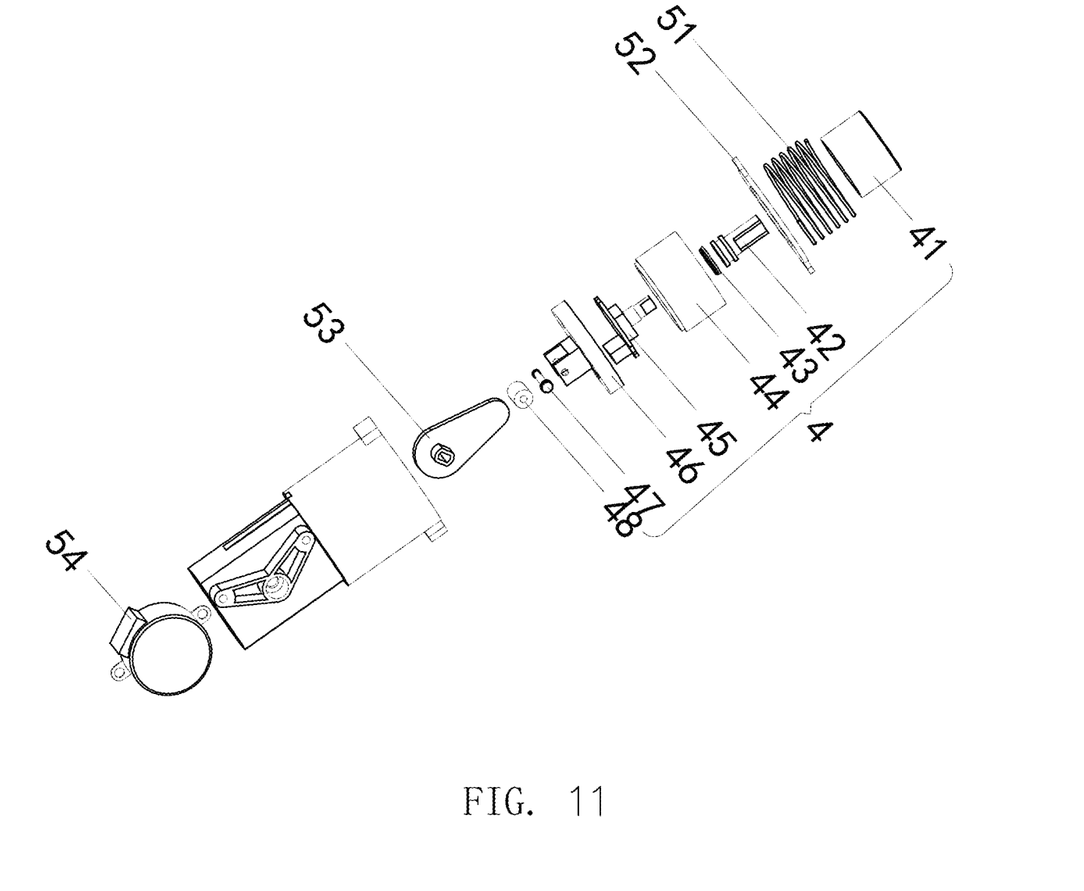
FIG. 11 is a three-dimensional exploded view of a retractable switch mechanism according to a third preferred embodiment of the present invention.

As shown in FIG. 6 to FIG. 10, a retractable switch mechanism in a second embodiment of the present invention is mainly different from the first embodiment in that the transmission assembly 32 in the present embodiment adopts a connecting rod transmission assembly 32. Specifically, the connecting rod transmission assembly 32 comprises a first connecting rod 323 and a second connecting rod 324. a first end of the first connecting rod 323 and the output shaft 311 of the driving motor 31 are in rotatable transmission fit; a second end of the first connecting rod 323 and a first end of the second connecting rod 324 are in pivoting fit; and a second end of the second connecting rod 324 and the knob assembly 2 are in pivoting fit. Specifically, as shown in FIG. 6, FIG. 8 and FIG. 10, the second end of the first connecting rod 323 is in pivoting fit with the first end of the second connecting rod 324 by a first pin 325, and the second end of the second connecting rod 324 is in pivoting fit with the second body 24b of the knob assembly 2 by a second pin 326.

The working process of the present embodiment: as shown in FIG. 7 and FIG. 8, when the induction unit senses that someone is near the intelligent toilet or someone sits on the intelligent toilet, the induction signal is sent to the main control board of the intelligent toilet, and the main control board controls the driving motor 31 of the driving unit 3 to rotate forward according to the induction signal. Then, the driving motor 31 drives the first connecting rod 323 to rotate forward around the first end of the first connecting rod 323 (the forward rotation is counterclockwise rotation in FIG. 8); then, the first connecting rod 323 drives the second end of the second connecting rod 324 to move in the direction close to the opening 12 of the base 1; and the second connecting rod 324 drives the knob assembly 2 so that the operating cover 21 moves from the second position to the first position for driving by hands.

As shown in FIG. 9 and FIG. 10, when the induction unit senses that someone is away from the intelligent toilet or someone is away from the seat, an induction signal is sent to the main control board of the intelligent toilet, and the main control board controls the driving motor 31 of the driving unit 3 to rotate reversely according to the induction signal. Then, the driving motor 31 drives the first connecting rod 323 to rotate reversely around the first end of the first connecting rod 323 (the forward rotation is clockwise rotation in FIG. 10); the first connecting rod 323 then drives the second end of the second connecting rod 324 to move in the direction away from the opening 12 of the base 1; and the second connecting rod 324 then drives the knob assembly 2 so that the operating cover 21 moves from the first position to the second position to realize the storage of the operating cover 21.

As shown in FIG. 11 to FIG. 15, a retractable switch mechanism in a third embodiment of the present invention comprises a housing group; the housing group comprises a housing, and a limiting cover 52 covered above the housing; the housing is provided with a cavity body; the cavity body is opened above and below; an operating assembly 1 that can move up and down, a first spring 51 sleeved above the operating assembly 1, and a driving cam 53 arranged below the operating assembly 1 are arranged in the cavity body; the first spring 51 is abutted against the limiting cover 52 for resetting the operating assembly 1; a driving motor 54 is arranged on the outer wall of the housing; and the driving motor 54 is connected with the driving cam 53 to drive the driving cam 53 to move.

The operating assembly 1 comprises an operating body 44 with a lower opening, and an operating rear cover 46 covered on the lower opening. The operating body 44 has an accommodating cavity, the upper end surface of the operating body 44 is provided with an upper opening, and the upper opening and the lower opening are communicated with the accommodating cavity. A through hole is formed on the operating rear cover 46; a control board 45 is arranged in the accommodating cavity; and a bulge on the control board 45 is inserted into the through hole so that the control board 45 is positioned. An operating rotating shaft sleeve 42 is sleeved above the control board 45. The upper opening is downward convexly provided with a rotating shaft hole, and the operating rotating shaft sleeve 42 is penetrated on the rotating shaft hole to extend outward toward the upper end surface of the operating body 44. A second sealing element 43 is also arranged between the rotating shaft hole and the operating rotating shaft sleeve 42 to seal a gap between the rotating shaft hole and the operating rotating shaft sleeve 42.

The limiting cover 52 is provided with an access hole penetrated up and down; the diameter of the access hole is less than the outer diameter of the operating body 44; the operating body 44 is limited by the limiting cover 52 and can only be accommodated in the cavity body; and an annular groove is arranged between the operating rear cover 46 and the operating body 44. The first spring 51 is sleeved outside the operating body 44; and the first spring 51 is accommodated in the annular groove. The operating assembly 1 is reset under the elastic action of the first spring 51 so that the upper end surface of the operating body 44 is abutted against the limiting cover 52, and the limiting cover 52 makes the operating assembly 1 not fall off from a side of the upper opening of the cavity body.

An operating cover 41 is covered above the operating rotating shaft sleeve 42, and the outer diameter of the operating cover 41 is less than the diameter of the access hole. The operating cover 41 is operated so that the operating assembly 1 moves downward, and the operating cover 41 then moves downward and enters the cavity body from the access hole.

The operating rear cover 46 is downward convexly provided with a connection position; the connection position is provided with two connection blocks arranged at an interval; a connection hole is formed at one end of the connection blocks away from the operating body 44; and a roller 48 is arranged between the two connection blocks. The roller 48 and the connection hole are connected together through a pin 47 as a rotating shaft. The driving cam 53 is arranged below the roller 48, and the roller 48 is used for rolling with the driving cam 53.

The operating assembly 1 is not limited to the knob assembly, the button assembly, etc., as long as it can perform operation and control. Moreover, the appearance shape of the operating assembly 1 can be a circle, a square, a diamond, etc., and the shape is not limited. The control form and the appearance shape of any operating assembly 1 are the protection scopes of the present invention.

A limiting groove is arranged on a side wall surface of the housing near one side of the driving cam 53, the limiting groove corresponds to the driving cam 53, and the driving cam 53 move in the limiting groove so that the operating assembly 1 can be extended upward or retracted downward.

An installation position corresponding to the driving cam 53 is arranged on the outer wall surface of the housing; an installation hole is arranged in the cavity body by the installation position; and the motor is installed at the installation position and connected with the driving cam 53 through the installation hole.

Figure 12:
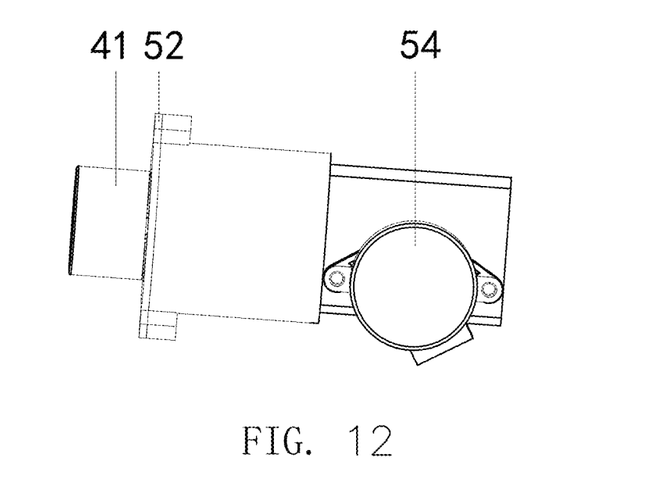
FIG. 12 is a three-dimensional assembly diagram when an operating cover of a retractable switch mechanism is in a first position according to the third preferred embodiment of the present invention.
Figure 13:
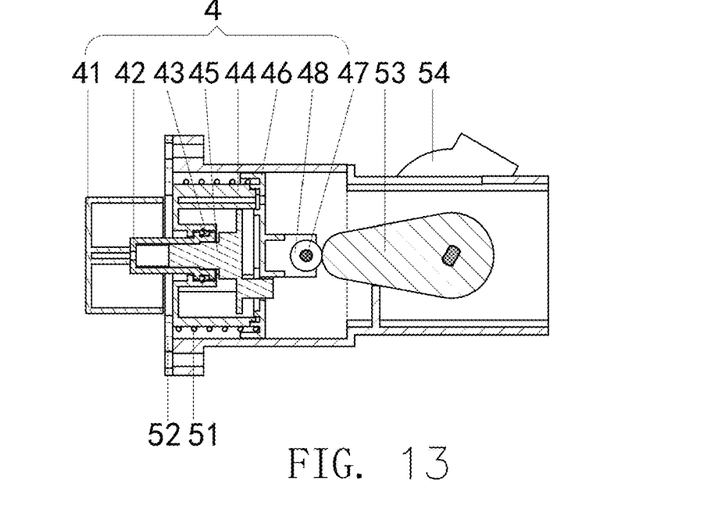
FIG. 13 is a sectional view when the operating cover of the retractable switch mechanism is in the first position according to the third preferred embodiment of the present invention.

The working process of the present embodiment: when the induction unit senses that someone is near the intelligent toilet or someone sits on the intelligent toilet, an induction signal is sent to the main control board of the intelligent toilet, and the main control board controls the driving motor 54 of the driving unit to rotate forward according to the induction signal. Then, the driving motor 54 drives the driving cam 53 to rotate forward; the driving cam 53 pushes the roller 48 to move in the direction near the opening of the housing; and the driving cam 53 then drives the operating assembly 4 so that the operating cover 41 moves from the second position to the first position for driving by hands.

Figure 14:
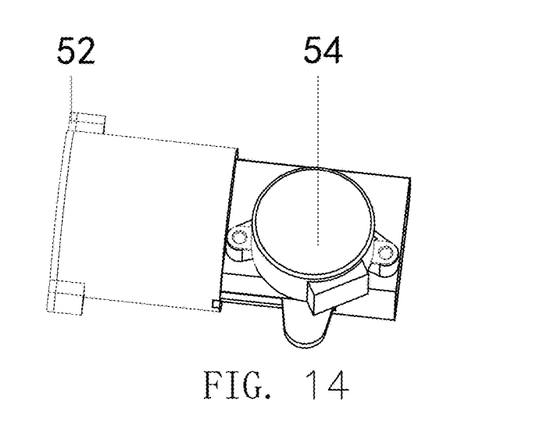
FIG. 14 is a three-dimensional assembly diagram when an operating cover of a retractable switch mechanism is in a second position according to the third preferred embodiment of the present invention.
Figure 15:
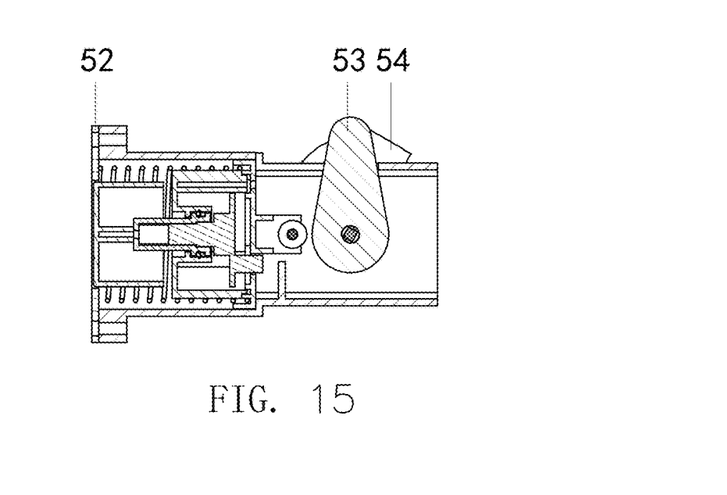
FIG. 15 is a sectional view when the operating cover of the retractable switch mechanism is in the second position according to the third preferred embodiment of the present invention.
Figure 16:
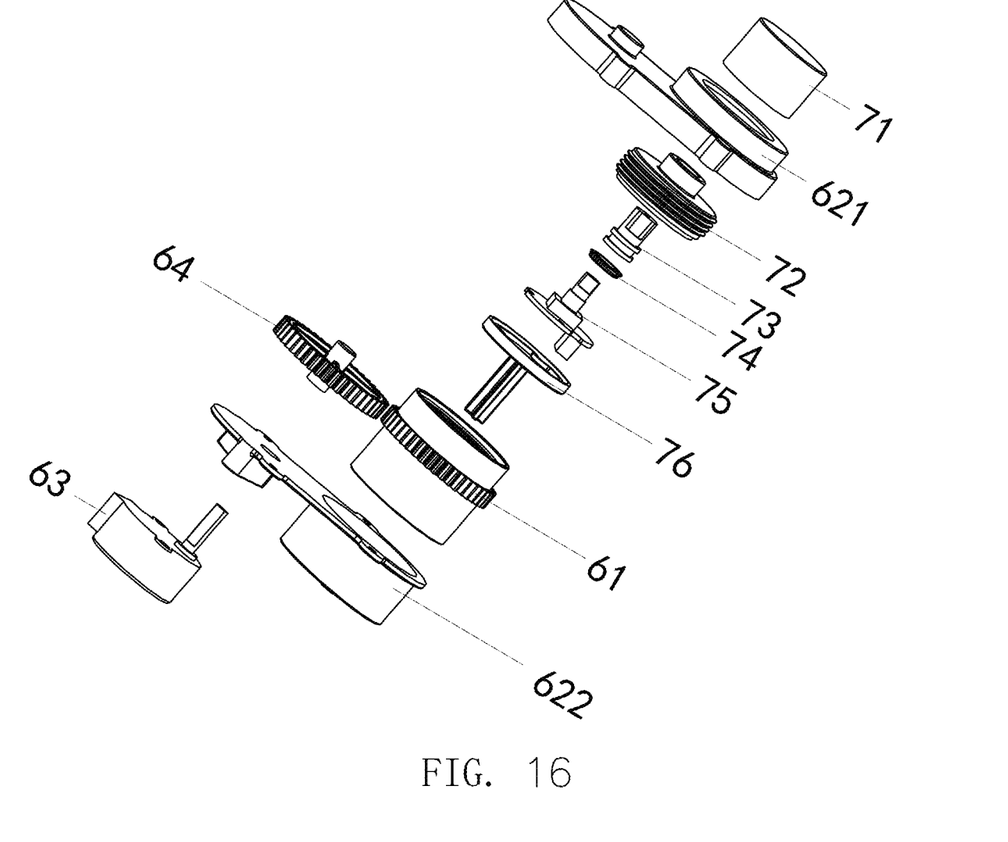
FIG. 16 is a three-dimensional exploded view of a retractable switch mechanism according to a fourth preferred embodiment of the present invention.
Figure 17:
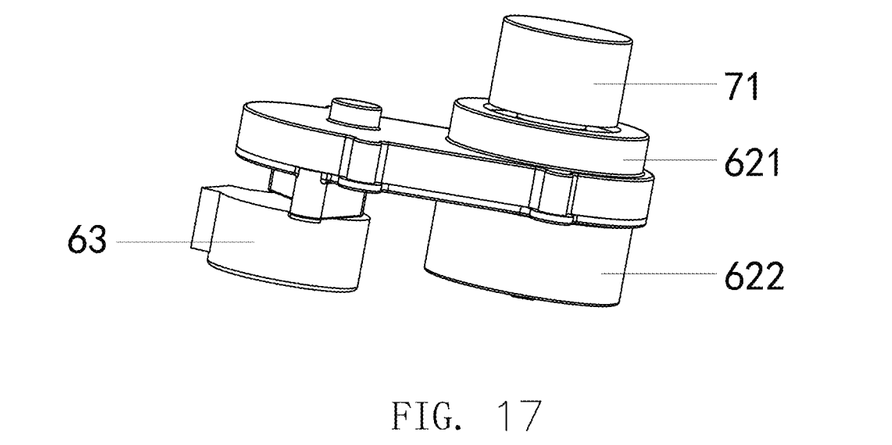
FIG. 17 is a three-dimensional assembly diagram when an operating cover of a retractable switch mechanism is in a first position according to the fourth preferred embodiment of the present invention.
Figure 18:
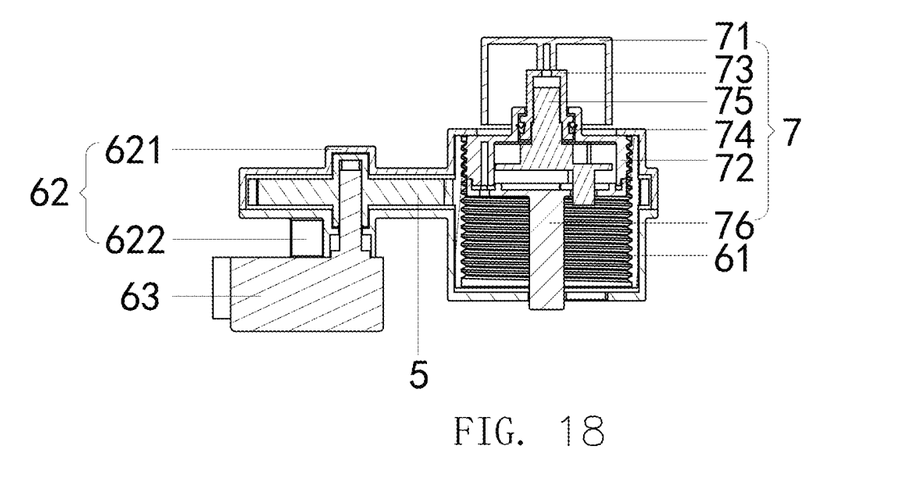
FIG. 18 is a sectional view when the operating cover of the retractable switch mechanism is in the first position according to the fourth preferred embodiment of the present invention.
Figure 19:
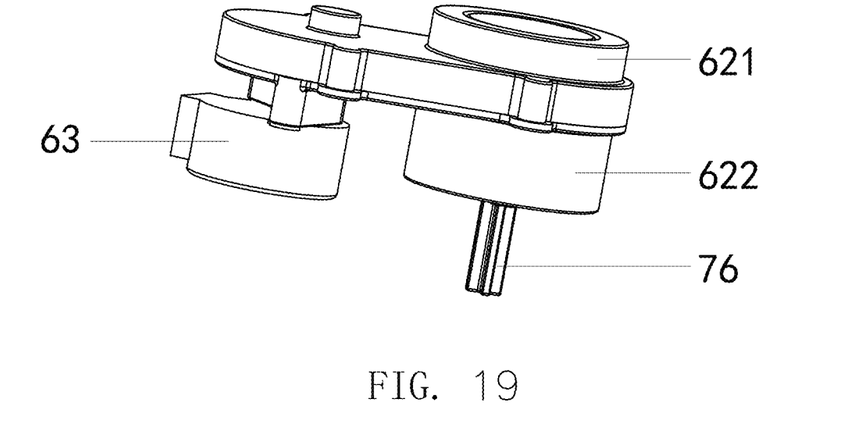
FIG. 19 is a three-dimensional assembly diagram when an operating cover of a retractable switch mechanism is in a second position according to the fourth preferred embodiment of the present invention.
Figure 20:
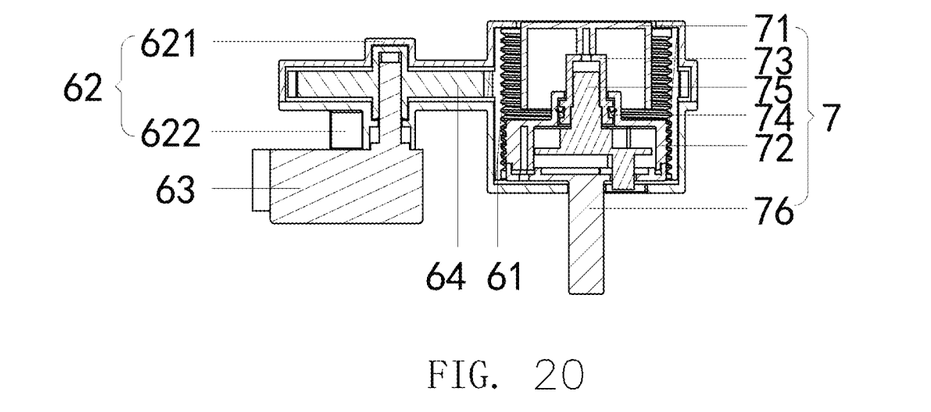
FIG. 20 is a sectional view when the operating cover of the retractable switch mechanism is in the second position according to the fourth preferred embodiment of the present invention.

When the induction unit senses that someone is away from the intelligent toilet or someone is away from the seat, an induction signal is sent to the main control board of the intelligent toilet, and the main control board controls the driving motor 54 of the driving unit to rotate reversely according to the induction signal. Then, the driving motor 54 drives the driving cam 53 to rotate reversely. The driving cam 53 pushes the roller 48 to move in a direction away from the opening of the housing, and the driving cam 53 then drives the operating assembly 4 so that the operating cover 41 moves from the first position to the second position to realize the storage of the operating cover 41.

As shown in FIG. 16 to FIG. 20, a retractable switch mechanism in a fourth embodiment of the present invention comprises a housing group 62, and the housing group 62 is provided with a first accommodating cavity, an upper and a lower openings penetrated in the first accommodating cavity, a second accommodating cavity communicated with the first accommodating cavity, and a side lower opening penetrated at the second accommodating cavity. A rotatable retractable sleeve 61 is arranged in the first accommodating cavity, and a retractable control assembly 7 is arranged in the retractable sleeve 61. A driving gear 64 connected with the retractable sleeve 61 is arranged in the second accommodating cavity; a driving motor 63 is arranged outside the second accommodating cavity; the driving motor 63 is penetrated through the side lower opening and connected with the driving gear 64; and the driving motor 63 drives the driving gear 64 to rotate to drive the retractable sleeve 61 to rotate, so that the control assembly 7 rotates relative to the retractable sleeve 61 to generate retractable motion.

The housing group 62 comprises an upper housing 621 and a lower housing 622 which is detachably and fixedly arranged below the upper housing 621; and the upper housing 621 and the lower housing 622 form the first accommodating cavity and the second accommodating cavity. Through detachable separation of the upper housing 621 and the lower housing 622, the retractable sleeve 61, the control assembly 7 and the driving gear 64 can be installed in the first accommodating cavity and the second accommodating cavity respectively.

The retractable sleeve 61 has a cavity body, and an upper through hole and a lower through hole which penetrate through the cavity body; an inner wall surface of the cavity body is provided with an internal screwing structure; an outer wall of the control assembly 7 is provided with an external screwing structure; and the external screwing structure and the internal screwing structure are screwed in a retractable and movable mode, so that the control assembly 7 is extended upward or retracted downward relative to the retractable sleeve 61. The internal screwing structure can be arranged as an internal thread or a spiral groove, and the external screwing structure can be arranged as an external thread corresponding to the internal thread or a spiral column corresponding to the spiral groove. An annular rack corresponding to the driving gear 64 is annularly arranged on the outer wall surface of the retractable sleeve 61, and the annular rack is engaged with the driving gear 64 so that the driving gear 64 rotates to drive the retractable sleeve 61 to rotate.

The outer diameter of the control assembly 7 is greater than the inner diameter of the upper opening and the inner diameter of the lower opening, so that when the control assembly 7 makes retractable motion, the control assembly 7 may not fall out of the first accommodating cavity, and the position of the retractable sleeve 61 is limited. The upper and lower ends of the second accommodating cavity corresponding to the side lower opening are provided with positioning grooves, a central shaft of the driving gear 64 is inserted into the positioning grooves, and a connecting shaft of the driving motor 63 is penetrated in the side lower opening, passes through the positioning grooves and is connected with the driving gear 64.

The control assembly 7 comprises a control body 72 with a lower opening and a control rear cover 76 covered on the lower opening; the outer diameter of the control body 72 is greater than the inner diameter of the upper opening and the inner diameter of the lower opening; and the external screwing structure is arranged on the outer wall of the control body 72. The control body 72 is provided with an accommodating cavity; the upper end surface of the control body 72 is provided with an upper opening; and the upper opening and the lower opening are communicated with the accommodating cavity. The control rear cover 76 is provided with a side through hole, a control board 75 is arranged in the accommodating cavity and a bulge on the control board 75 is inserted at the side through hole so that the control board 75 is positioned. A control rotating shaft sleeve 73 is sleeved above the control board 75. The upper opening is upward convexly provided with a rotating shaft hole; the control rotating shaft sleeve 73 is penetrated at the rotating shaft hole and extends outward toward the upper end surface of the control body 72; and a sealing ring 74 is also arranged between the rotating shaft hole and the control rotating shaft sleeve 73 to seal a gap between the rotating shaft hole and the control rotating shaft sleeve 73.

A control cover 71 is covered above the control rotating shaft sleeve 73; the outer diameter of the control cover 71 is less than the diameter of the upper opening; the control cover 71 is operated so that the control assembly 7 moves downward; and the control cover 71 then moves downward and enters the first accommodating cavity from the upper opening.

The control rear cover 76 is downward convexly provided with a guide column, and the guide column is movably penetrated at the lower opening. The control assembly 7 is guided and positioned in the first accommodating cavity through the guide column, to prevent the control assembly 7 from rotating with the retractable sleeve 61 that rotates, thereby ensuring that the control assembly 7 makes linear movement.

The control assembly 7 is not limited to the knob assembly, the button assembly, etc., as long as it can perform operation and control. Moreover, the appearance shape of the control assembly 7 can be a circle, a square, a diamond, etc., and the shape is not limited. The control form and the appearance shape of any control assembly 7 are the protection scopes of the present invention.

Figure 21:
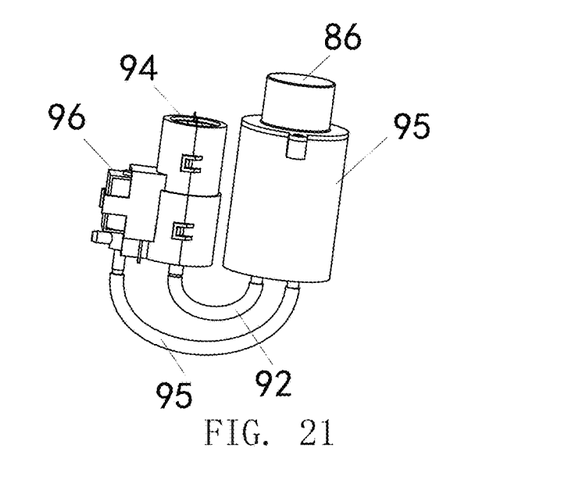
FIG. 21 is a three-dimensional assembly diagram of a retractable switch mechanism according to a fifth preferred embodiment of the present invention.
Figure 22:
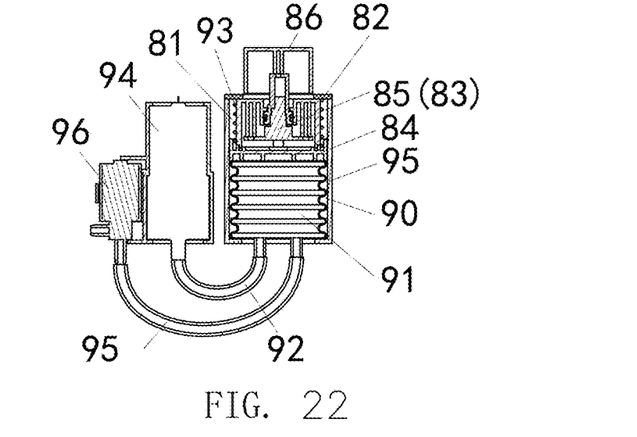
FIG. 22 is a sectional view when the operating cover of the retractable switch mechanism is in the first position according to the fifth preferred embodiment of the present invention.
Figure 23:
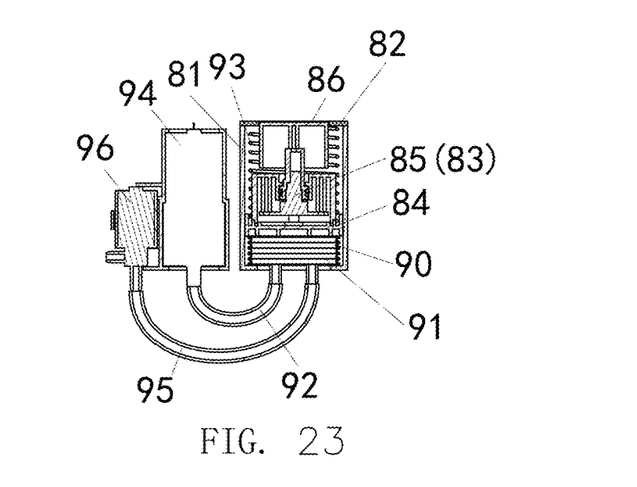
FIG. 23 is a sectional view when the operating cover of the retractable switch mechanism is in the second position according to the fifth preferred embodiment of the present invention.

As shown in FIG. 21 to FIG. 23, a retractable switch mechanism in a fifth embodiment of the present invention further comprises a switch assembly. The switch assembly comprises a switch, and a housing provided with an accommodating cavity 81 and an opening 82 communicated with the accommodating cavity 81. A knob seat 83 is arranged in the accommodating cavity 81. The knob seat 83 reciprocates along a direction close to or away from the opening 82; the knob seat 83 is rotatably provided with a knob 86, and the knob 86 is the switch; when the knob seat 83 moves, the knob 86 is driven to extend out of the accommodating cavity 81 from the opening 82 or retracts into the accommodating cavity 81 from the opening 82; the knob seat 83 is in transmission fit with a moving element; the driving unit is a gas supply unit; the gas supply unit has a gas supply channel 92; a pressure cavity 91 communicated with the gas supply channel 92 is arranged in the accommodating cavity 81; and the moving element moves under the action of air pressure of the pressure cavity 91, so that the knob 86 extends out of the accommodating cavity 81.

The present embodiment further comprises an elastic element 93. The knob seat 83 is reset under the action of the elastic element 93, so that the knob 86 retracts back into the accommodating cavity 81. Specifically, the elastic element 93 is a second spring abutted between the knob seat 83 and the housing 95.

In the present embodiment, the moving element is an air bag 96, and an inner cavity of the air bag 96 forms the pressure cavity 91. In other embodiments, the moving element is a piston arranged in the accommodating cavity 81, and the piston is matched with the inner wall of the accommodating cavity 81 to form the pressure cavity 91.

In the present embodiment, the gas supply unit comprises an air pump 94, and the air pump 94 supplies air for the pressure cavity 91 through the gas supply channel 92.

The present embodiment further comprises an exhaust channel 95 communicated with the pressure cavity 91 and an exhaust control valve 96. The exhaust control valve 96 is a solenoid valve.

In the present embodiment, the knob seat 83 comprises a knob rear cover 84 and a knob circuit board 85 arranged on the knob rear cover 84.

The main difference from the second embodiment is that: in the present embodiment, the driving unit adopts a pneumatic retractable structure. The pneumatic retractable structure comprises a gas supply unit and a second spring; the gas supply unit 9 has an exhaust control valve 91, an air bag 92, and a gas supply channel 9293 for connecting the exhaust control valve 91 and the air bag 92; and the exhaust control valve 91 controls gas to enter and leave the air bag 92 from the gas supply channel 9293 so that the air bag 92 drives the switch assembly to extend and retract inside and outside the housing. The gas supply unit also has an air pump 94 and an exhaust channel 95 for connecting the air pump 94 and the air bag 92. The air pump 94 absorbs the gas in the air bag 92 through the exhaust channel 95, so that the air bag 92 shrinks downward and drives the switch assembly to retract downward. The exhaust control valve 96 supplies gas for the air bag 92 through the gas supply channel 9293 so that the air bag 92 extends upward to push the switch assembly to extend upward.

Figure 24:
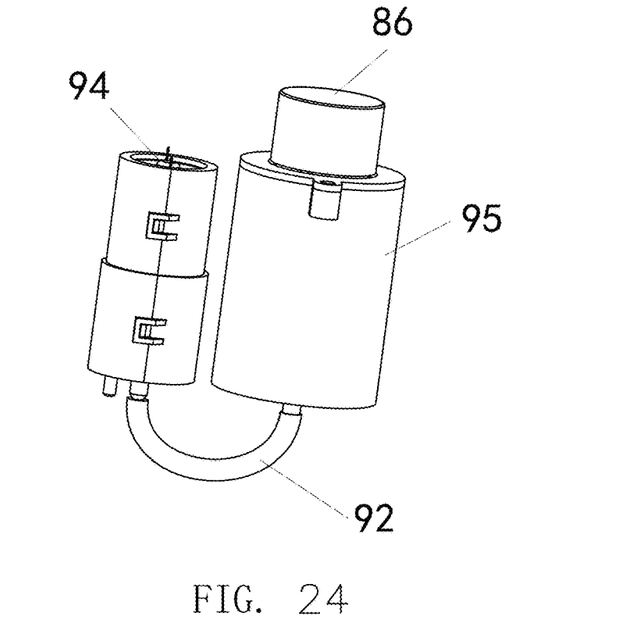
FIG. 24 is a three-dimensional assembly diagram of a retractable switch mechanism according to a sixth preferred embodiment of the present invention.
Figure 25:
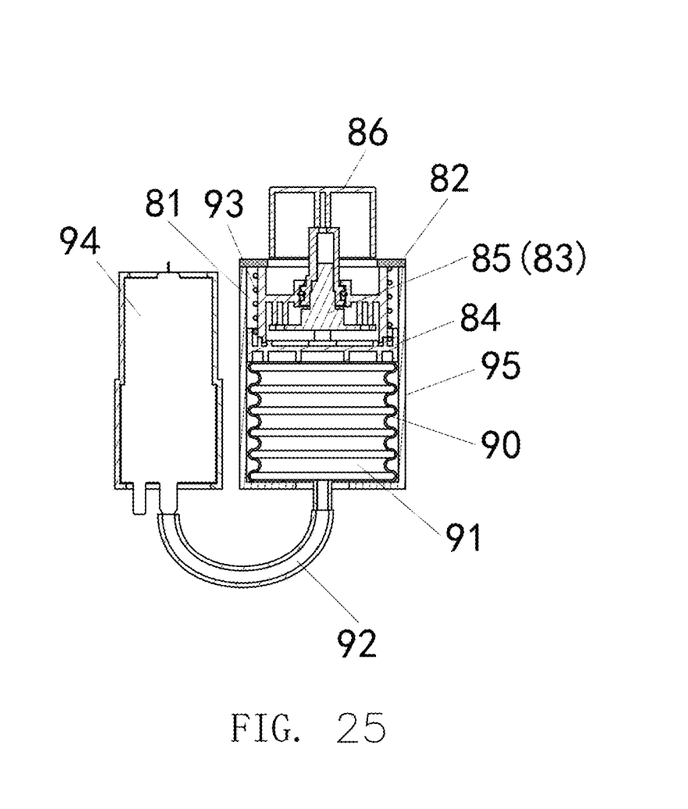
FIG. 25 is a sectional view of a retractable switch mechanism according to the sixth preferred embodiment of the present invention.

As shown in FIG. 24 and FIG. 25, a retractable switch mechanism in a sixth embodiment of the present invention has the main difference from the fifth embodiment that: in the present embodiment, the driving unit adopts the pneumatic retractable structure. The pneumatic retractable structure comprises the gas supply unit. The gas supply unit has an exhaust control valve 96, an air bag 92, and a gas supply channel 92 for connecting the exhaust control valve 96 and the air bag 92, and the exhaust control valve 96 controls the gas from entering and leaving the air bag 92 through the gas supply channel 92, so that the air bag 92 drives the switch assembly to extend and retract inside and outside the housing. The exhaust control valve 96 supplies gas or pumps the gas for the air bag 92 through the gas supply channel 92, so that the air bag 92 extends upward or retracts to push the switch assembly to extend up or retract down. The gas absorbed or pumped out by the exhaust control valve 96 is absorbed or discharged through an exhaust hole below the exhaust control valve 96.

The working process of the fourth embodiment is similar to that of the first embodiment, and the working processes of the fifth embodiment and the sixth embodiment are similar to that of the third embodiment, which will not be further described here.

Preferred embodiments of the present invention are shown and described in the above illustration. As described above, it shall be understood that the present invention is not limited to the form disclosed herein, shall not be regarded as exclusion of other embodiments, but can be used in various other combinations, modifications and environments, and can be modified within the scope of the invention conception described herein through the above instruction or the technology or knowledge in the related field. The modification and change made by those skilled in the art without departing from the spirit and the scope of the present invention shall be within the protection scope of the attached claims in the present invention.

We claim:

1. A retractable switch mechanism, comprising an intelligent toilet having an inner cavity and a switch assembly arranged in the inner cavity of the intelligent toilet, wherein an avoidance hole communicated with the inner cavity of the intelligent toilet is formed in a side wall of the intelligent toilet, and the switch assembly comprises a switch capable of moving between a first position where the switch extends out of the avoidance hole and a second position where the switch retracts into the avoidance hole.

2. The retractable switch mechanism according to claim 1, further comprising a driving unit which is used for driving the switch to move between the first position where the switch extends out of the avoidance hole and the second position where the switch retracts into the avoidance hole; or
further comprising a mechanical retractable unit which is driven by the switch when the switch is driven, wherein the mechanical retractable unit controls the switch to alternately switch between the first position and the second position.

3. The retractable switch mechanism according to claim 2, wherein the switch assembly further comprises a base; the base is arranged in the inner cavity of the intelligent toilet; the base is provided with an accommodating cavity; the accommodating cavity has an opening corresponding to the avoidance hole; the switch is located in the accommodating cavity; the switch extends out of the opening when located in the first position; and the switch retracts into the opening when located in the second position.

4. The retractable switch mechanism according to claim 3, wherein the switch assembly is a knob assembly; the switch is an operating cover capable of rotating relative to the base; the knob assembly further comprises a control board and a rotating element; the control board is in limit fit with the base in a rotation direction of the operating cover; the rotating element is in rotatable transmission fit with the operating cover; and the operating cover drives the rotating element to rotate relative to the control board.

5. The retractable switch mechanism according to claim 4, wherein the knob assembly further comprises a knob body arranged on the base; the control board is accommodated in an inner cavity of the knob body; the knob body is provided with a port communicated with the inner cavity of the knob body; the rotating element is penetrated on the port; and the operating cover is installed on the rotating element and located outside the knob body.

6. The retractable switch mechanism according to claim 5, wherein a first sealing element is arranged between an outer wall of the rotating element and an inner wall of the port.

7. The retractable switch mechanism according to claim 5, wherein the knob body is movably arranged on the base; and the driving unit drives the knob body to move relative to the base and then drives the operating cover to move between the first position and the second position; or,
the knob body is fixedly arranged on the base, and the driving unit drives the knob cover to move relative to the knob body.

8. The retractable switch mechanism according to claim 3, wherein the driving unit is arranged on the base; the driving unit comprises a driving motor and a transmission assembly; the driving motor drives the switch assembly through the transmission assembly; the transmission assembly adopts a gear and rack transmission assembly; the gear and rack transmission assembly comprises a gear and a rack engaged with each other; the gear is rotatably arranged on the base; an output shaft of the driving motor is connected with the gear; the rack is connected with the switch assembly; or, the transmission assembly adopts a connecting rod transmission assembly; the connecting rod transmission assembly comprises a first connecting rod and a second connecting rod; a first end of the first connecting rod and the output shaft of the driving motor are in rotatable transmission fit; a second end of the first connecting rod and a first end of the second connecting rod are in pivoting fit; and a second end of the second connecting rod and the switch assembly are in pivoting fit.

9. The retractable switch mechanism according to claim 2, further comprising an induction unit, wherein the induction unit sends an induction signal to a main control board of the intelligent toilet, and the main control board controls the driving unit to drive forward or reversely according to the induction signal.

10. The retractable switch mechanism according to claim 2, wherein the switch assembly further comprises a shell group; the shell group has a cavity body with upper and lower openings; an operating assembly capable of moving up and down is arranged in the cavity body; the operating assembly is sleeved with a first spring, and the first spring is limited between a lower end surface of the operating assembly and the upper opening; one end of the operating assembly away from the upper opening is fitted with the driving unit connected inside and outside the cavity body; the driving unit drives the operating assembly to move upward and extend; and the first spring can push the operating assembly to move down and reset.

11. The retractable switch mechanism according to claim 10, wherein the operating assembly comprises an operating body, an operating rear cover covered on the lower end surface of the operating body, a control board arranged in the operating body, an operating rotating shaft sleeve sleeved above the control board, an operating cover sleeved above the operating rotating shaft sleeve, and a roller connected to the operating rear cover; the roller is connected with the operating rear cover through a pin; the operating rotating shaft sleeve is hermetically matched with the operating body through a second sealing element; and the switch is the operating cover.

12. The retractable switch mechanism according to claim 11, wherein the operating body has an accommodating cavity with upper and lower openings; the operating rear cover is covered at the lower opening; the operating rear cover is provided with a through hole; the control board is provided with a bulge; the control board is accommodated in the accommodating cavity and the bulge is inserted in the through hole; the upper opening is downward convexly provided with a rotating shaft hole; the operating rotating shaft sleeve is penetrated on the rotating shaft hole and extends outward toward an upper end surface of the operating body; and the second sealing element is arranged between the rotating shaft hole and the operating rotating shaft sleeve.

13. The retractable switch mechanism according to claim 10, wherein the shell group comprises a housing, and a limiting cover covered above the housing; the upper opening is arranged on the limiting cover; the lower opening is arranged on the lower end surface of the housing; the diameter of the upper opening is less than the outer diameter of the operating body; and the operating body is limited inside the limiting cover.

14. The retractable switch mechanism according to claim 13, wherein the outer diameter of the operating cover is less than the diameter of the upper opening hole, and the operating cover moves down with the operating assembly and enters the cavity body.

15. The retractable switch mechanism according to claim 14, wherein an annular groove is arranged between the operating rear cover and the operating body, the first spring is sleeved outside the operating body, and the first spring is accommodated in the annular groove.

16. The retractable switch mechanism according to claim 15, wherein the operating rear cover is downward convexly provided with a connection position, the connection position is provided with two connection blocks arranged at an interval, and the roller is connected between the two connection blocks through the pin.

17. The retractable switch mechanism according to claim 16, wherein the driving unit is arranged below the roller; the driving unit comprises a driving cam arranged in the cavity body and directly below the roller, and a driving motor arranged outside the cavity body and corresponding to the driving cam; and the driving motor is connected with the driving cam to drive the driving cam to move and push the operating assembly to move up and extend.

18. The retractable switch mechanism according to claim 17, wherein a limiting groove is arranged on a side wall surface of the housing near one side of the driving cam, the limiting groove corresponds to the driving cam, and the driving cam is movably arranged in the limiting groove.

19. The retractable switch mechanism according to claim 18, wherein an installation position corresponding to the driving cam is arranged on the outer wall surface of the housing, and the motor is installed on the installation position and connected with the driving cam.

20. The retractable switch mechanism according to claim 2, wherein the switch assembly further comprises a housing group, and a retractable group rotatably arranged in the housing group; the housing group is provided with a first accommodating cavity, an upper and a lower openings penetrated in the first accommodating cavity, a second accommodating cavity communicated with the first accommodating cavity, and a side lower opening penetrated at the second accommodating cavity; the retractable group is arranged in the first accommodating cavity; the retractable group comprises a retractable sleeve arranged in the first accommodating cavity, and a control element retractably arranged in the retractable sleeve; the switch is arranged on the retractable group; the driving unit is arranged inside and outside the second accommodating cavity; the driving unit is penetrated through the side lower opening and connected with the retractable sleeve; and the driving unit drives the retractable sleeve to rotate so that the control element rotates relative to the retractable sleeve to generate retractable movement.

21. The retractable switch mechanism according to claim 20, wherein the driving unit comprises a driving gear arranged in the second cavity, and a driving motor arranged outside the second cavity and connected with the driving gear through the side lower opening; the housing group comprises an upper housing and a lower housing which is detachably and fixedly arranged below the upper housing; the upper housing and the lower housing form the first accommodating cavity and the second accommodating cavity to install and accommodate the retractable sleeve and the driving gear; and the driving motor drives the driving gear to rotate to drive the retractable sleeve to rotate, so that the control element rotates relative to the retractable sleeve to generate retractable movement.

22. The retractable switch mechanism according to claim 21, wherein the retractable sleeve has a cavity body, and an upper through hole and a lower through hole which penetrate through the cavity body; an inner wall surface of the cavity body is provided with an internal screwing structure; an outer wall of the control element is provided with an external screwing structure corresponding to the internal screwing structure; and the external screwing structure and the internal screwing structure are retractably and movably connected.

23. The retractable switch mechanism according to claim 22, wherein an annular rack corresponding to the driving gear is annularly arranged on the outer wall surface of the retractable sleeve, and the annular rack is engaged with the driving gear so that the driving gear drives the retractable sleeve to rotate during rotation.

24. The retractable switch mechanism according to claim 20, wherein the outer diameter of the control element is greater than the inner diameters of the upper opening and the lower opening to restrict the control element to retract and move in the first accommodating cavity.

25. The retractable switch mechanism according to claim 24, wherein the upper and lower ends of the second accommodating cavity corresponding to the side lower opening are provided with positioning grooves, a central shaft of the driving gear is inserted into the positioning grooves, and a connecting shaft of the driving motor is penetrated in the side lower opening, passes through the positioning grooves and is connected with the driving gear.

26. The retractable switch mechanism according to claim 25, wherein the control element comprises a control body with a lower opening and a control rear cover covered on the lower opening; the outer diameter of the control body is greater than the inner diameter of the upper opening and the inner diameter of the lower opening; and the external screwing structure is arranged on the outer wall of the control body.

27. The retractable switch mechanism according to claim 26, wherein the control body is provided with an accommodating cavity with an upper and a lower openings; the control rear cover is provided with a side through hole; a control board is arranged in the accommodating cavity; a bulge on the control board is inserted at the side through hole; and a control rotating shaft sleeve is sleeved above the control board.

28. The retractable switch mechanism according to claim 27, wherein the upper opening of the accommodating cavity is upward convexly provided with a rotating shaft hole; the control rotating shaft sleeve is penetrated at the rotating shaft hole and extends outward toward the upper end surface of the control body; a third sealing element is arranged between the rotating shaft hole and the control rotating shaft sleeve; a control cover is covered above the control rotating shaft sleeve; the outer diameter of the control cover is less than the diameter of the upper opening; and the control cover is the switch.

29. The retractable switch mechanism according to claim 28, wherein the control rear cover is downward convexly provided with a guide column, and the guide column is movably penetrated at the lower opening.

30. The retractable switch mechanism according to claim 2, wherein the switch assembly further comprises a housing provided with an accommodating cavity and an opening communicated with the accommodating cavity; a knob seat is arranged in the accommodating cavity; the knob seat reciprocates along a direction close to or away from the opening; the knob seat is rotatably provided with a knob, and the knob is the switch; when the knob seat moves, the knob is driven to extend out of the accommodating cavity from the opening or retracts into the accommodating cavity from the opening; the knob seat is in transmission fit with a moving element; the driving unit is a gas supply unit; the gas supply unit has a gas supply channel; a pressure cavity communicated with the gas supply channel is arranged in the accommodating cavity; and the moving element moves under the action of air pressure of the pressure cavity, so that the knob extends out of the accommodating cavity.

31. The retractable switch mechanism according to claim 30, further comprising an elastic element, wherein the knob seat is reset under the action of the elastic element, so that the knob retracts back into the accommodating cavity.

32. The retractable switch mechanism according to claim 30, wherein the moving element is a piston arranged in the accommodating cavity, and the piston is matched with the inner wall of the accommodating cavity to form the pressure cavity.

33. The retractable switch mechanism according to claim 30, wherein the moving element is an air bag, and an inner cavity of the air bag forms the pressure cavity.

34. The retractable switch mechanism according to claim 30, wherein the gas supply unit comprises an air pump, and the air pump supplies air for the pressure cavity through the gas supply channel.

35. The retractable switch mechanism according to claim 34, wherein the air pump pumps out the gas of the pressure cavity through the gas supply channel.

36. The retractable switch mechanism according to claim 2, further comprising an exhaust channel communicated with the pressure cavity and an exhaust control valve.

37. The retractable switch mechanism according to claim 36, wherein the exhaust control valve is a solenoid valve.

38. The retractable switch mechanism according to claim 2, wherein the knob seat comprises a knob rear cover and a knob circuit board arranged on the knob rear cover.

39. The retractable switch mechanism according to claim 1, wherein the intelligent toilet comprises an intelligent toilet seat and an intelligent toilet cover; the intelligent toilet seat or the intelligent toilet cover is provided with the inner cavity of the intelligent toilet and the avoidance hole; the switch assembly is a knob assembly or a handle assembly or a button assembly or a control panel assembly; and correspondingly, the switch adopts a knob cover or a handle or a button or a control panel.

* * * * *